(12) United States Patent
Okamoto

(10) Patent No.: US 11,307,275 B2
(45) Date of Patent: Apr. 19, 2022

(54) ARRAY COIL

(71) Applicant: CANON MEDICAL SYSTEMS CORPORATION, Otawara (JP)

(72) Inventor: Kazuya Okamoto, Saitama (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/123,545

(22) Filed: Sep. 6, 2018

(65) Prior Publication Data
US 2019/0072626 A1 Mar. 7, 2019

(30) Foreign Application Priority Data
Sep. 7, 2017 (JP) .............................. JP2017-172476

(51) Int. Cl.
*G01R 33/36* (2006.01)
*G01R 33/34* (2006.01)
*G01R 33/3415* (2006.01)

(52) U.S. Cl.
CPC ... *G01R 33/3642* (2013.01); *G01R 33/34007* (2013.01); *G01R 33/3415* (2013.01); *G01R 33/34046* (2013.01); *G01R 33/34084* (2013.01); *G01R 33/365* (2013.01)

(58) Field of Classification Search
CPC .......... G01R 33/34007; G01R 33/3415; G01R 33/34084; G01R 33/3642; G01R 33/365; G01R 33/34046
See application file for complete search history.

(56) References Cited

U.S. PATENT DOCUMENTS

| 3,806,782 | A | * | 4/1974 | Matsui | .................... | B60L 13/03 |
| | | | | | | 104/282 |
| 4,825,162 | A | | 4/1989 | Roemer et al. | | |
| 7,663,367 | B2 | * | 2/2010 | Wiggins | ................. | A61B 5/055 |
| | | | | | | 324/318 |
| 7,759,936 | B2 | * | 7/2010 | Iwadate | ........... | G01R 33/34007 |
| | | | | | | 324/318 |
| 8,571,632 | B2 | * | 10/2013 | Piron | .................... | A61B 8/0825 |
| | | | | | | 600/411 |

(Continued)

FOREIGN PATENT DOCUMENTS

| JP | 2008-12292 | 1/2008 |
| WO | WO 2014/208501 A1 | 12/2014 |

OTHER PUBLICATIONS

Graham C. Wiggins, et al., "Size-adaptable "Trellis" receive array concept for knee imaging", Proc. Intl. Soc. Mag. Reson. Med., 24, 2016, 3 pages.

*Primary Examiner* — Alesa Allgood
(74) *Attorney, Agent, or Firm* — Oblon, McClelland, Maier & Neustadt, L.L.P.

(57) ABSTRACT

An array coil according to an embodiment includes a plurality of element coils, a first electrically-insulative coupler, and a second electrically-insulative coupler. Each of the plurality of element coils has a first fixation point and a second fixation point. The plurality of element coils are two-dimensionally arrayed in a first direction and a second direction while overlapping one another. The first electrically-insulative coupler is configured to couple together two or more of the first fixation points in the first direction. The second electrically-insulative coupler is configured to couple together two or more of the second fixation points in the first direction.

8 Claims, 9 Drawing Sheets

(56) References Cited

U.S. PATENT DOCUMENTS

| | | | |
|---|---|---|---|
| 9,241,765 B2 * | 1/2016 | Piron | A61B 8/0825 |
| 2012/0286917 A1 * | 11/2012 | Uchida | H01F 17/0013 |
| | | | 336/200 |
| 2016/0089294 A1 * | 3/2016 | Guillaume | A61G 15/08 |
| | | | 600/14 |
| 2016/0135711 A1 | 5/2016 | Dohata et al. | |
| 2017/0316867 A1 * | 11/2017 | Kamijima | H01F 27/2804 |
| 2017/0316868 A1 * | 11/2017 | Kamijima | H01F 27/2804 |

* cited by examiner

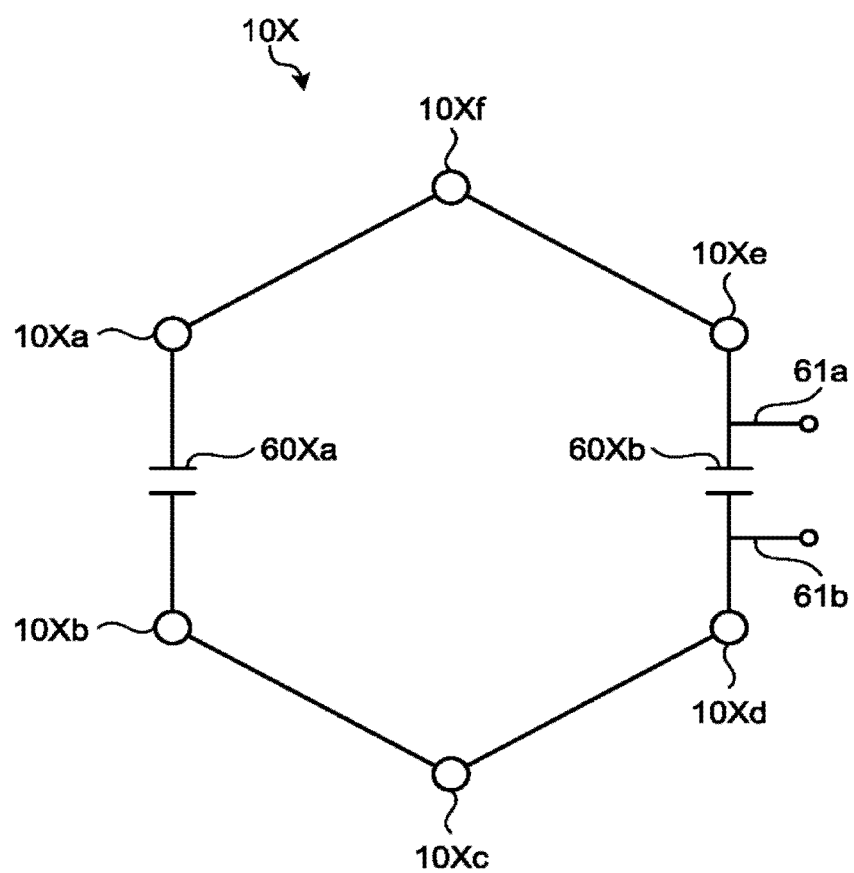

ARRAY COIL

CROSS-REFERENCE TO RELATED APPLICATIONS

This application is based upon and claims the benefit of priority from Japanese Patent Application No. 2017-172476, filed on Sep. 7, 2017; the entire contents of which are incorporated herein by reference.

FIELD

Embodiments described herein relate generally to an array coil.

BACKGROUND

For magnetic resonance imaging, a method is known by which a magnetic resonance signal is detected from an examined subject by using an array coil in which a plurality of element coils are arrayed. When such an array coil in which a plurality of element coils are arrayed is used, it is desirable to prevent the plurality of element coils from being coupled to one another (i.e., to decouple the plurality of element coils from one another) to ensure that even when a radio frequency current having a predetermined frequency flows into one of the element coils, no radio frequency current flows into the other element coils.

Further, it is desirable to design array coils to fit various image taking locations of patients. For example, it is desirable when array coils are able to expand and contract in accordance with the physique of each examined subject, image taking sites, and image taking methods being used. For example, for taking images of knees, when an array coil is able to expand and contract, it is possible to use the array coil both for examined subjects having larger knees and for examined subjects having smaller knees.

BRIEF DESCRIPTION OF THE DRAWINGS

FIG. 9 is a drawing for explaining one of element coils included in an array coil according to another embodiment.

DETAILED DESCRIPTION

Figure 1:
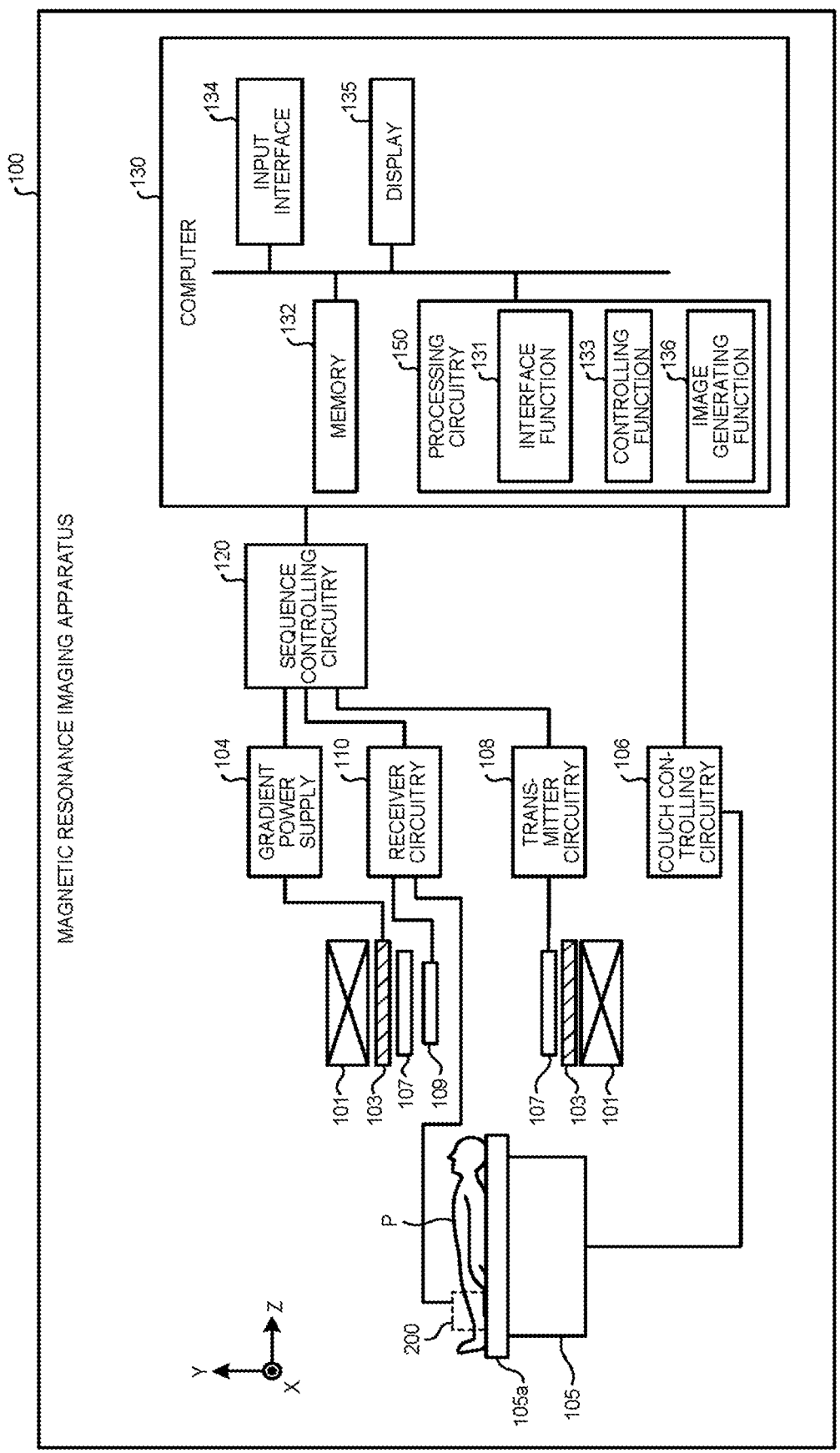
FIG. 1 is a diagram illustrating an example of a magnetic resonance imaging apparatus in which an array coil according to an embodiment is used.

An array coil according to an embodiment includes a plurality of element coils, a first electrically-insulative coupler, and a second electrically-insulative coupler. Each of the plurality of element coils has a first fixation point and a second fixation point. The plurality of element coils are two-dimensionally arrayed in a first direction and a second direction while overlapping one another. The first electrically-insulative coupler is configured to couple together two or more of the first fixation points in the first direction. The second electrically-insulative coupler is configured to couple together two or more of the second fixation points in the first direction.

Exemplary embodiments of the present disclosure will be explained, with reference to the accompanying drawings. Some of the constituent elements that are the same as one another will be referred to by using the same reference characters, and any duplicate explanations will be omitted.

First Embodiment

To begin with, an example of a magnetic resonance imaging apparatus in which an array coil according to an embodiment is used will be explained, with reference to FIG. 1. FIG. 1 is a block diagram illustrating an example of a magnetic resonance imaging apparatus 100 in which an array coil 200 according to the embodiment is used. As illustrated in FIG. 1, the magnetic resonance imaging apparatus 100 includes a static magnetic field magnet 101, a static magnetic field power source (not illustrated), a gradient coil 103, a gradient power source 104, a couch 105, couch controlling circuitry 106, a transmitter coil 107, transmitter circuitry 108, a receiver coil 109, receiver circuitry 110, sequence controlling circuitry 120 (a sequence controlling unit), and a computer 130 (which may be referred to as an "image processing apparatus"). The magnetic resonance imaging apparatus 100 does not include an examined subject (hereinafter, "patient") P (e.g., a human body). The configuration illustrated in FIG. 1 is merely an example. For instance, any of the constituent elements of the sequence controlling circuitry 120 and the computer 130 may be integrated together or separated from the other constituent elements, as appropriate.

The static magnetic field magnet 101 is a magnet formed to have a hollow and substantially circular cylindrical shape and configured to generate a static magnetic field in the space on the inside thereof. For example, the static magnetic field magnet 101 may be a superconductive magnet or the like and is configured to cause magnetic excitation by receiving a supply of an electric current from the static magnetic field power source. The static magnetic field power source is configured to supply the electric current to the static magnetic field magnet 101. Alternatively, the static magnetic field magnet 101 may be a permanent magnet. In that situation, the magnetic resonance imaging apparatus 100 does not necessarily have to include the static magnetic field power source. Further, the static magnetic field power source may be provided separately from the magnetic resonance imaging apparatus 100.

The gradient coil 103 is a coil formed to have a hollow and substantially circular cylindrical shape and is disposed on the inside of the static magnetic field magnet 101. The gradient coil 103 is structured by combining together three coils corresponding to X-, Y-, and Z-axes that are orthogonal to one another. By individually receiving a supply of an electric current from the gradient power source 104, these three coils are configured to generate gradient magnetic fields of which the magnetic field intensities change along the X-, Y-, and Z-axes respectively. The gradient magnetic fields generated along the X-, Y-, and Z-axes by the gradient coil 103 are, for example, a slice gradient magnetic field Gs, a phase-encoding gradient magnetic field Ge, and a read-out gradient magnetic field Gr. The gradient power source 104 is configured to supply the electric currents to the gradient coil 103.

The couch 105 includes a couchtop 105a on which the patient P is placed. Under control of the couch controlling circuitry 106, the couchtop 105a is inserted to the inside of a hollow space (an image taking opening) of the gradient coil 103, while the patient P is placed thereon. Usually, the couch 105 is installed in such a manner that the longitudinal direction thereof extends parallel to the central axis of the static magnetic field magnet 101. Under control of the computer 130, the couch controlling circuitry 106 is configured to move the couchtop 105a in longitudinal directions and up-and-down directions by driving the couch 105.

The transmitter coil 107 is disposed on the inside of the gradient coil 103 and is configured to generate a radio frequency magnetic field by receiving a supply of a Radio Frequency (RF) pulse from the transmitter circuitry 108. The transmitter circuitry 108 is configured to supply the transmitter coil 107 with the RF pulse corresponding to a Larmor frequency determined by the type of the targeted atom and intensities of magnetic fields.

The receiver coil 109 is disposed on the inside of the gradient coil 103 and is configured to receive magnetic resonance signals (which hereinafter may be referred to as "MR signals" as necessary) emitted from the patient P due to an influence of the radio frequency magnetic field. When having received the magnetic resonance signals, the receiver coil 109 outputs the received magnetic resonance signals to the receiver circuitry 110. An example of the receiver coil 109 is a coil for the head, for instance.

The transmitter coil 107 and the receiver coil 109 described above are merely examples. One or more coils may be configured by selecting one or combining two or more from among the following: a coil having only a transmitting function; a coil having only a receiving function; and a coil having transmitting and receiving functions.

As the array coil 200, a plurality of small receiver coils are disposed to surround an image taking region, so as to be able to obtain an image having an excellent SNR by performing an image reconstructing process while using pieces of data acquired at mutually the same time. It is often the case that the array coil 200 is designed to acquire signals from a specific body part (e.g., the head, the abdomen, an arm, a shoulder, an elbow, a wrist, a knee, a leg, the chest, the spine, or the like), in accordance with an image taking region.

In an example, the array coil 200 includes a plurality of element coils each of which is configured to extract a signal by using LC (inductance-capacitance) resonance, a predetermined circuit element used for an impedance matching process, and a pre-amplifier used for amplifying the signal. For example, the signals extracted by the plurality of element coils included in the array coil 200 are amplified by the pre-amplifier and output to the receiver circuitry 110 in units called channels or the like. For this reason, pieces of magnetic resonance data are handled in units of channels in the processes performed at the stages in and after the receiver circuitry 110. As for the relationship in quantities, the total number of element coils may be equal to the total number of channels. Alternatively, the total number of channels may be smaller than the total number of element coils. Conversely, the total number of channels may be larger than the total number of element coils.

The receiver circuitry 110 is configured to detect the magnetic resonance signals output from the receiver coil 109 and from the array coil 200 and to generate magnetic resonance image data on the basis of the detected magnetic resonance signals. More specifically, the receiver circuitry 110 generates the magnetic resonance image data by performing a digital conversion on the magnetic resonance signals output from the receiver coil 109 and from the array coil 200. Further, the receiver circuitry 110 is configured to transmit the generated magnetic resonance image data to the sequence controlling circuitry 120. The receiver circuitry 110 may be provided on the side of a gantry device where the static magnetic field magnet 101, the gradient coil 103, and the like are provided.

The sequence controlling circuitry 120 is configured to perform an image taking process on the patient P by driving the gradient power source 104, the transmitter circuitry 108, and the receiver circuitry 110 on the basis of sequence information transmitted thereto from the computer 130. In this situation, the sequence information is information defining a procedure for performing the image taking process. The sequence information defines: the intensity of the electric current to be supplied from the gradient power source 104 to the gradient coil 103 and the timing with which the electric current is to be supplied; the intensity of the RF pulse to be supplied from the transmitter circuitry 108 to the transmitter coil 107 and the timing with which the RF pulse is to be applied; the timing with which the magnetic resonance signals are to be detected by the receiver circuitry 110, and the like. For example, the sequence controlling circuitry 120 may be an integrated circuit such as an Application Specific Integrated Circuit (ASIC), a Field Programmable Gate Array (FPGA) or the like or an electronic circuit such as a Central Processing Unit (CPU), a Micro Processing Unit (MPU), or the like. Details of a pulse sequence executed by the sequence controlling circuitry 120 will be explained later.

Further, when having received the magnetic resonance data from the receiver circuitry 110 as a result of performing the image taking process on the patient P by driving the gradient power source 104, the transmitter circuitry 108, and the receiver circuitry 110, the sequence controlling circuitry 120 is configured to transfer the received magnetic resonance data to the computer 130.

The computer 130 is configured to exercise overall control of the magnetic resonance imaging apparatus 100 and to generate images, and the like. The computer 130 includes a memory 132, an input interface 134, a display 135, and processing circuitry 150. The processing circuitry 150 includes an interface function 131, a controlling function 133, and an image generating function 136.

In the first embodiment, processing functions performed by the interface function 131, the controlling function 133, and the image generating function 136 are stored in the memory 132 in the form of computer-executable programs. The processing circuitry 150 is a processor configured to realize the functions corresponding to the programs by reading and executing the programs from the memory 132. In other words, the processing circuitry 150 that has read the programs has the functions illustrated within the processing circuitry 150 in FIG. 1. FIG. 1 illustrates an example in which the single processing circuitry (i.e., the processing circuitry 150) realizes the processing functions performed by the interface function 131, the controlling function 133, and the image generating function 136; however, another arrangement is also acceptable in which the processing circuitry 150 is structured by combining together a plurality of independent processors, so that the functions are realized as a result of the processors executing the programs. In other words, it is acceptable to configure each of the functions described above as a program, so that the single processing circuitry (i.e., the processing circuitry 150) executes the programs. Alternatively, one or more specific functions each may be installed in a dedicated independent program-executing circuit.

The term "processor" used in the above explanation denotes, for example, a Central Processing Unit (CPU), a Graphical Processing Unit (GPU), or a circuit such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]). The one or more processors realize the functions by reading and executing the programs stored in the memory 132.

Further, instead of saving the programs in the memory 132, it is also acceptable to directly incorporate the programs in the circuits of the processors. In that situation, the processors realize the functions thereof by reading and executing the programs incorporated in the circuits thereof. Similarly, the couch controlling circuitry 106, the transmitter circuitry 108, the receiver circuitry 110, and the like are also each configured with an electronic circuit such as the processor defined above.

By employing the interface function 131, the processing circuitry 150 is configured to transmit the sequence information to the sequence controlling circuitry 120 and to receive the magnetic resonance data from the sequence controlling circuitry 120. When having received the magnetic resonance data, the processing circuitry 150 including the interface function 131 is configured to store the received magnetic resonance data into the memory 132.

The magnetic resonance data stored in the memory 132 is arranged into a k-space by the controlling function 133. As a result, the memory 132 stores therein the k-space data.

The memory 132 is configured to store therein the magnetic resonance data received by the processing circuitry 150 having the interface function 131; the k-space data arranged into the k-space by the processing circuitry 150 having the controlling function 133; image data generated by the processing circuitry 150 having the image generating function 136; and the like. For example, the memory 132 is configured with a semiconductor memory element such as a Random Access Memory (RAM), a flash memory, or the like, or a hard disk, an optical disk, or the like.

The input interface 134 is configured to receive inputs of various types of instructions and information from the operator. The input interface 134 is, for example, a pointing device such as a mouse and/or a trackball; a selecting device such as a mode changing switch; and/or an input device such as a keyboard. The display 135 is configured to display, under control of the processing circuitry 150 having the controlling function 133, a Graphical User Interface (GUI) used for receiving inputs of image taking conditions, as well as images generated by the processing circuitry 150 having the image generating function 136, and the like. The display 135 is, for example, a display device configured with a liquid crystal display monitor, or the like.

By employing the controlling function 133, the processing circuitry 150 is configured to control image taking processes, image generating processes, image display processes, and the like, by exercising overall control of the magnetic resonance imaging apparatus 100. For example, the processing circuitry 150 having the controlling function 133 receives an input of an image taking condition (e.g., an image taking parameter or the like) via the GUI and generates sequence information according to the received image taking condition. Further, the processing circuitry 150 having the controlling function 133 transmits the generated sequence information to the sequence controlling circuitry 120. By employing the image generating function 136, the processing circuitry 150 is configured to generate an image by reading the k-space data from the memory 132 and performing a reconstructing process such as a Fourier transform on the read k-space data.

Figure 2:
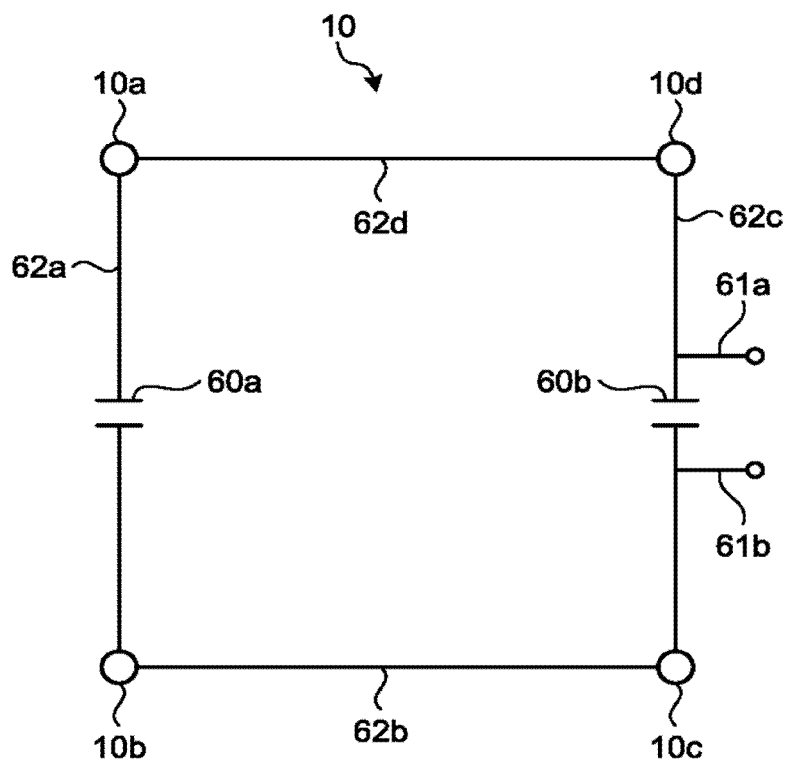
FIG. 2 is a drawing for explaining one of element coils included in an array coil according to a first embodiment.

Next, a configuration of the array coil 200 according to the first embodiment will be explained, with reference to FIGS. 2 to 5. First, element coils included in the array coil 200 will be explained, with reference to FIG. 2. FIG. 2 is a drawing for specifically explaining an element coil 10, which is one of the plurality of element coils included in the array coil 200.

In FIG. 2, conductor wires 62a, 62b, 62c, and 62d are configured by using, for example, a conductive material such as copper. As illustrated in FIG. 2, an LC resonant circuit is structured with a circuit including the conductor wires 62a to 62d, by using a capacitance (C) related to capacitors 60a and 60b and an inductance (L) of the coil. A magnetic resonance signal induced by the coil is output to output terminals 61a and 61b. Although not illustrated in FIG. 2, as a circuit element structuring the element coil, it is also acceptable to provide a circuit element such as a coil for the purpose of performing the impedance matching process. The signal output to the output terminals 61a and 61b are amplified by the pre-amplifier and are output to the receiver circuitry 110. As illustrated, each of the plurality of element coils included in the array coil 200 is, for example, a polygonal coil having even-numbered corners. In one example, each of the element coils included in the array coil 200 is a rectangular coil having a symmetrical shape in the up-and-down direction and the left-and-right direction, for example.

In FIG. 2, pivots 10a, 10b, 10c, and 10d are elements that are each capable of changing the angles between two conductive members while keeping the conduction states thereof. For example, the pivot 10a is capable of changing the angle between the conductor wires 62a and 62d while keeping the conduction state between the conductor wires 62a and 62d. The pivot 10b is capable of changing the angle between the conductor wires 62a and 62b while keeping the conduction state between the conductor wires 62a and 62b. Similarly, the pivots 10c and 10d are each capable of changing the angle between the conductor wires 62b and 62c and the angle between the conductor wires 62c and 62d, while keeping the conduction states between the conductor wires 62b and 62c and between the conductor wires 62c and 62d, respectively.

With these arrangements, the array coil 200 is configured so that each of the plurality of element coils included in the array coil 200 is a coil having pivotable corners (apexes).

As the material of the pivots, a metal such as copper may be used, for example. Alternatively, a harder material may be used to prevent abrasion or the like.

Further, as for the structure of the pivots, the two conductive members may directly be grounded to each other, or conversely, an electrically-insulative (hereinafter, simply "insulative") member such as resin may be inserted between the two conductive members. When an insulative member such as resin is inserted between the two conductive members, the insulative member functions as a capacitor, while the pivot itself serves as a part of the capacitance of the circuit. In this manner, each of the pivots may be given a role of a capacitor, in addition to the function as a pivot.

Figure 3:
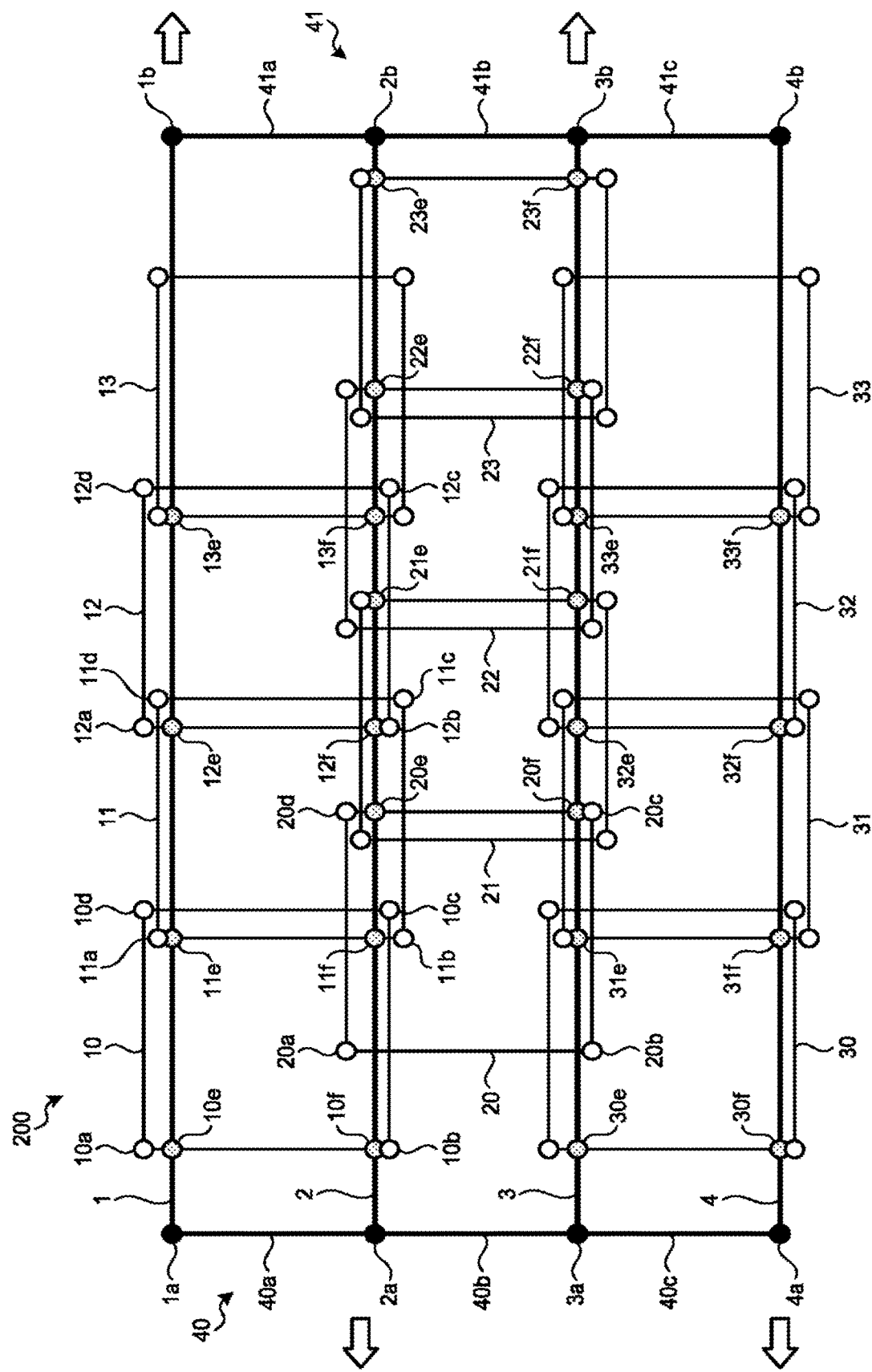
FIG. 3 is a drawing for explaining the array coil according to the first embodiment.

FIG. 3 is a drawing for explaining the array coil 200 according to the first embodiment. In FIG. 3, element coils 10, 11, 12, 13, 20, 21, 22, 23, 30, 31, 32, and 33 are the plurality of coils included in the array coil 200. The element coils 10, 11, 12, and 13 are examples of a row of element coils arranged along a first direction. Similarly, the element coils 20, 21, 22, and 23 represent a row of element coils arranged along the first direction. Further, for example, the element coil 10 and the element coil 20 are element coils that are positioned adjacent to each other in a second direction. Similarly, for example, the element coils 11 and 20, the element coils 20 and 30, the element coils 20 and 31, and the like are element coils that are positioned adjacent to each other in the second direction.

As illustrated in FIG. 3, the element coil 10 and the element coil 11 are arranged so as to overlap each other for the purpose of decoupling the element coils from each other. In this situation, the decoupling of the element coils from each other denotes preventing the element coils from being coupled to each other. More specifically, the decoupling of the element coils from each other denotes ensuring that even when a radio frequency current having a predetermined frequency is caused to flow into one of the element coils, no radio frequency current is induced thereby and flows into the other element coils, and vice versa. In other words, decoupling the element coil 10 and the element coil 11 from each other means to ensure that, even when a radio frequency current flows into the element coil 10, the magnetic field generated by the radio frequency current does not cause any radio frequency current to flow into the element coil 11 and that, conversely, even when a radio frequency current flows into the element coil 11, the magnetic field generated by the radio frequency current does not cause any radio frequency current to flow into the other element coil 10. To realize the decoupling of the element coils from each other, it is sufficient when an overlapping area between the element coils is in a predetermined ratio to the original area of the element coil. Accordingly, the element coils 10 and 11 are arranged so as to overlap each other in such a manner that the overlapping area between the element coils 10 and 11 is in the predetermined ratio to the original area of each of the element coils 10 and 11.

Similarly, to realize the decoupling of the element coils 11 and 12 from each other, the element coils 11 and 12 are arranged so as to overlap each other in such a manner that the overlapping area between the element coils 11 and 12 is in the predetermined ratio to the original area of each of the element coils 11 and 12. By arranging the element coils so as to overlap each other in this manner, it is possible to realize the decoupling of the element coils from each other with respect to the first direction.

Further, for example, to realize the decoupling of the element coils 10 and 20 from each other, the element coils 10 and 20 are arranged so as to overlap each other in such a manner that the overlapping area between the element coils 10 and 20 is in the predetermined ratio to the original area of each of the element coils 10 and 20.

Further, for example, to realize the decoupling of the element coils 20 and 21 from each other and the decoupling of the element coils 11 and 21 from each other, the element coil 21 is arranged in such a manner that the overlapping area between the element coils 20 and 21 has a predetermined size, while the overlapping area between the element coils 11 and 21 has a predetermined size. Similarly, the element coils 22, 23, 30, and so on are also each arranged to overlap certain element coils to realize the decoupling from the certain element coils positioned adjacent thereto.

For example, the element coils have mutually the same shape. As a result, it is possible to develop the plurality of element coils two-dimensionally while arranging the element coils to overlap one another by the predetermined area. With these arrangements, it is possible to realize the decoupling of the plurality of element coils included in the array coil 200 from one another. Further, for example, the element coils are configured to have mutually the same size.

In this manner, in the array coil 200, the plurality of element coils are two-dimensionally arrayed in the first direction (the left-and-right direction of FIG. 3) and in the second direction (the up-and-down direction of FIG. 3) while overlapping one another.

Next, a structure related to expansion and contraction of the array coil 200 will be explained. The pivots 10a, 10b, 10c, and 10d are pivots in the element coil 10, and the angle formed by the two sides at the corner served by each of the pivots is variable. Similarly, pivots 11a, 11b, 11c, and 11d are pivots in the element coil 11, and the angle formed by the two sides at the corner served by each of the pivots is variable. Also, pivots 12a, 12b, 12c, and 12d are pivots in the element coil 12, and the angle formed by the two sides at the corner served by each of the pivots is variable. Further, pivots 20a, 20b, 20c, and 20d are pivots in the element coil 20, and the angle formed by the two sides at the corner served by each of the pivots is variable. Similarly, each of the other white dots in FIG. 3 represents a pivot, and the angle formed by the two sides at the corner served by the pivot is variable.

A fixation point 10e is a first fixation point in the element coil 10 and is used for fixing an insulative coupler 1 (explained later) and the element coil 10 together. Further, a fixation point 10f is a second fixation point in the element coil 10 and is used for fixing an insulative coupler 2 (explained later) and the element coil 10 together. The fixation points 10e and 10f are each structured so that the angle formed by a conductive member of the element coil 10 and the insulative coupler is variable. The fixation points 10e and 10f may each be realized by using a pivot or the like.

Similarly, a fixation point 11e is a first fixation point used for fixing the insulative coupler 1 and the element coil 11 together. Further, a fixation point 11f is a second fixation point used for fixing the insulative coupler 2 and the element coil 11 together. Also, a fixation point 12e is a first fixation point used for fixing the insulative coupler 1 and the element coil 12 together. In addition, a fixation point 12f is a second fixation point used for fixing the insulative coupler 2 and the element coil 12 together. Furthermore, a fixation point 13e is a first fixation point used for fixing the insulative coupler 1 and the element coil 13 together. In addition, a fixation point 13f is a second fixation point used for fixing the insulative coupler 2 and the element coil 13 together. Fixation points 20e, 21e, 22e, and 23e are each a fixation point used for fixing the insulative coupler 2 and a corresponding one of the element coils 20, 21, 22, and 23 together, respectively. Fixation points 20f, 21f, 22f, and 23f are each a fixation point used for fixing an insulative coupler 3 and a corresponding one of the element coils 20, 21, 22, and 23 together, respectively. Similarly, fixation points 30e, 31e, 32e, and 33e are each a fixation point used for fixing the insulative coupler 3 and a corresponding one of the element coils 30, 31, 32, and 33 together, respectively. Furthermore, fixation points 30f, 31f, 32f, and 33f are each a fixation point used for fixing an insulative coupler 4 and a corresponding one of the element coils 30, 31, 32, and 33 together, respectively. Each of the fixation points is realized by using a pivot, for example.

The insulative couplers 1, 2, 3, and 4 are each a member configured to couple a plurality of element coils in the first direction, by using the fixation points of the element coils. Each of the insulative couplers 1, 2, 3, and 4 is configured by using an insulative member such as a plastic stick, for example; however, the material of each of the insulative couplers 1, 2, 3, and 4 is not limited to a stick, and may be a material that is flexible and of which the shape can freely be changed. The insulative coupler 1 is configured to couple together a plurality of fixation points in the first direction, by coupling together the fixation point 10e of the element coil 10, the fixation point 11e of the element coil 11, the fixation point 12e of the element coil 12, and the fixation point 13e of the element coil 13. The insulative coupler 2 is configured to couple together a plurality of fixation points in the first direction, by coupling together the fixation point 10f of the element coil 10, the fixation point 11f of the element coil 11, the fixation point 12f of the element coil 12, the fixation point 13f of the element coil 13, the fixation point 20e of the element coil 20, the fixation point 21e of the element coil 21, the fixation point 22e of the element coil 22, and the fixation point 23e of the element coil 23. Similarly, the insulative coupler 3 is configured to couple together a plurality of fixation points in the first direction, by coupling together the fixation point 20f of the element coil 20, the fixation point 21f of the element coil 21, the fixation point 22f of the element coil 22, the fixation point 23f of the element coil 23, the fixation point 30e of the element coil 30, the fixation point 31e of the element coil 31, the fixation point 32e of the element coil 32, and the fixation point 33e of the element coil 33. Also, the insulative coupler 4 is configured to couple together a plurality of fixation points in the first direction, by coupling together the fixation point 30f of the element coil 30, the fixation point 31f of the element coil 31, the fixation point 32f of the element coil 32, and the fixation point 33f of the element coil 33.

In other words, each of the element coils included in the array coil 200 has the first fixation point and the second fixation point and includes at least a first insulative coupler configured to couple together two or more of the plurality of first fixation points in the first direction and a second insulative coupler configured to couple together two or more of the plurality of second fixation points in the first direction.

In the first embodiment, each of the insulative couplers other than the insulative couplers positioned at the two ends is configured to couple together the element coils positioned adjacent to one another in the second direction. For example, the insulative coupler 2 couples together the element coils 11 and 20, which are element coils positioned adjacent to each other in the second direction, by coupling together the fixation point 11f and the fixation point 20e. Similarly, for example, the insulative coupler 3 couples together the element coils 20 and 31, which are element coils positioned adjacent to each other in the second direction, by coupling together the fixation point 20f and the fixation point 31e. With these arrangements, when a force is applied to any of the insulative couplers, it is possible to have the force transmitted to the entirety of the array coil 200.

A member 40 is a member configured to fix the insulative couplers 1, 2, 3, 4, and so on via pivots 1a, 2a, 3a, and 4a. More specifically, the member 40 includes a member 40a that is a part between the pivot 1a and the pivot 2a, a member 40b that is a part between the pivot 2a and the pivot 3a, a member 40c that is a part between the pivot 3a and the pivot 4a, and so on. The pivot 1a is fixed to the insulative coupler 1. The pivots 2a, 3a, and 4a are fixed to the insulative couplers 2, 3, and 4, respectively. Further, to ensure that the angles formed by the members 40a, 40b, and 40c with one another are variable, the joints between these members are configured by using pivotable constituent elements such as the pivots 1a, 2a, 3a, and 4a, for example.

Similarly, a member 41 is a member configured to fix the insulative couplers 1, 2, 3, 4, and so on via the pivots 1b, 2b, 3b, and 4b. More specifically, the member 41 includes a member 41a that is a part between the pivot 1b and the pivot 2b, a member 41b that is a part between the pivot 2b and the pivot 3b, a member 41c that is a part between the pivot 3b and the pivot 4b, and so on. The pivot 1b is fixed to the insulative coupler 1. Further, the pivots 2b, 3b, and 4b are fixed to the insulative couplers 2, 3, and 4, respectively. Further, to ensure that the angles formed by the members 41a, 41b, and 41c with one another are variable, the joints between these members are configured by using pivotable constituent elements such as the pivots 1b, 2b, 3b, and 4b, for example.

Figure 4:
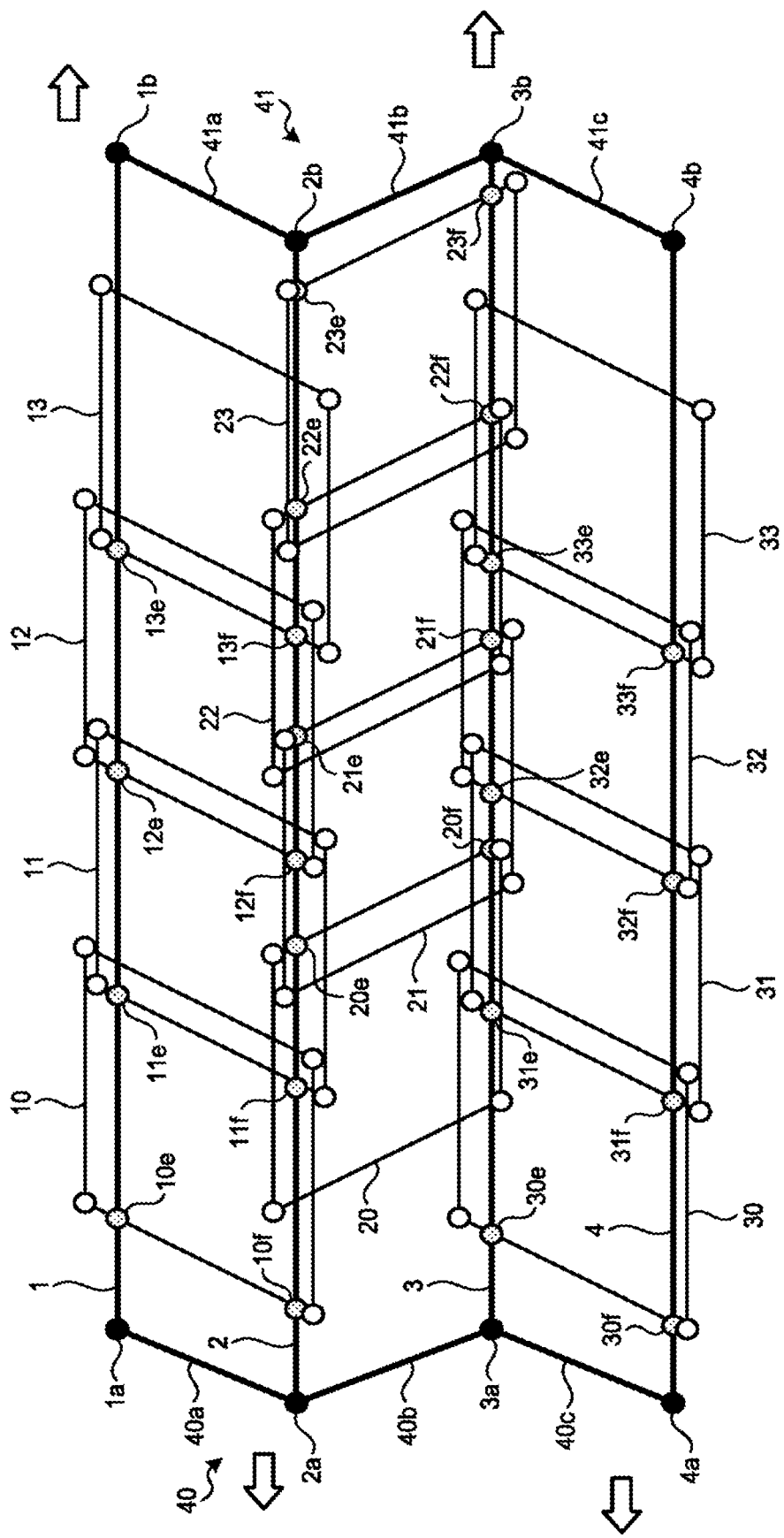
FIG. 4 is another drawing for explaining the array coil according to the first embodiment.

Expansion and contraction of the array coil 200 configured as described above are illustrated in FIG. 4. FIG. 4 is a drawing for explaining the expansion and the contraction of the array coil 200 according to the first embodiment.

In the array coil 200 illustrated in FIG. 3, let us discuss a situation in which a force toward the right-hand side is applied to the insulative coupler 1 and to the insulative coupler 3, while a force toward the left-hand side is conversely applied to the insulative coupler 2 and to the insulative coupler 4. In that situation, as illustrated in FIG. 4, these displacements are transmitted to the entirety of the array coil 200, and the array coil 200 expands and contracts. More specifically, for example, because the array coil 200 changes the shape thereof in such a manner that the members 40a, 40b, 40c, 41a, 41b, 41c, and so on are shifted to be positioned in diagonal directions, the array coil 200 contracts in the up-and-direction of FIG. 4. On the contrary, the array coil 200 expands in the left-and-right direction of FIG. 4. Further, when a force toward the left-hand side is applied to the insulative coupler 1 and to the insulative coupler 3, while a force toward the right-hand side is conversely applied to the insulative coupler 2 and to the insulative coupler 4, the array coil 200 expands in the up-and-down direction of FIG. 5 and contracts in the left-and-right direction of FIG. 5. As a result, the array coil 200 is configured to be expandable and contractible.

Even when the array coil 200 has changed the shape thereof as illustrated in FIG. 4, because the ratio of the overlapping area between the element coils to the area of each of the element coils remains unchanged even after the change of the shape, the decoupling of the element coils from one another is realized even after the expansion and the contraction.

Figure 5:
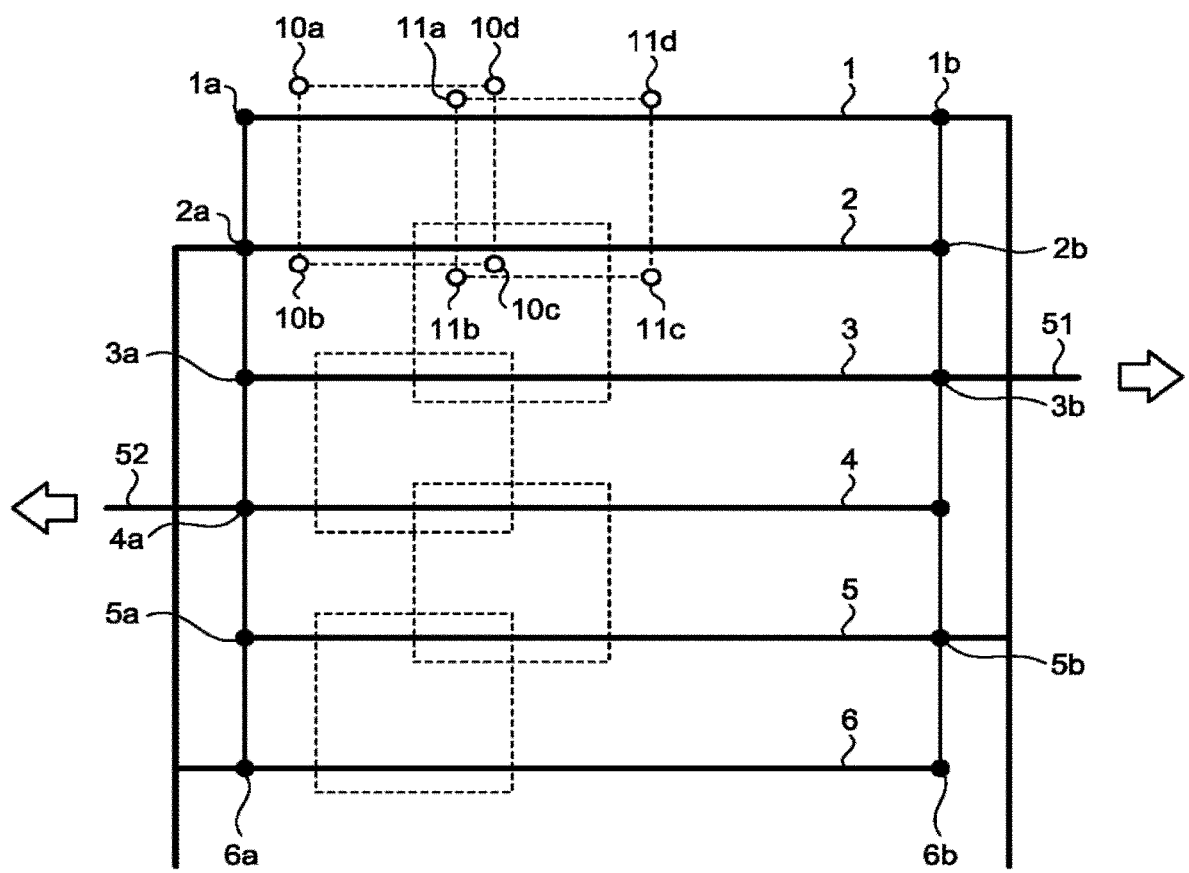
FIG. 5 is yet another drawing for explaining the array coil according to the first embodiment.

For example, it is acceptable to couple the members 40 and 41 to a frame configured to make it possible to move a plurality of insulative couplers at the same time, so that it is possible to easily perform the operation of applying a force toward the left-hand side to the insulative coupler 1 and to the insulative coupler 3 and conversely applying a force toward the right-hand side to the insulative coupler 2 and to the insulative coupler 4. This configuration will be explained with reference to FIG. 5. FIG. 5 is yet another drawing for explaining the array coil according to the first embodiment. FIG. 5 is a drawing reduced in size from FIG. 3 and illustrates an array coil having five rows of element coils, in contrast to FIG. 3 where the array coil is illustrated with the three rows of element coils for the sake of convenience in the explanation. Further, details of the element coils depicted in FIG. 3 are omitted as appropriate in FIG. 5. The reference numerals 1, 2, 3, 4, 5, and 6 denote insulative couplers.

In the following sections, the insulative couplers 1, 3, and 5 will be referred to as first insulative couplers, whereas the insulative coupler 2, 4, and 6 will be referred to as second insulative couplers. As observed from the example of the insulative coupler 1, the first insulative couplers are each configured to couple together two or more of the plurality of first fixation points (the fixation points indicated with the subscripts "e" in FIG. 3) in the first direction. Further, as observed from the example of the insulative coupler 2, the second insulative couplers are each configured to couple together two or more of the plurality of second fixation points (the fixation points indicated with the subscripts "f" in FIG. 3) in the first direction. The array coil 200 includes the two or more first insulative couplers and the two or more second insulative couplers.

The pivots 1*a* and 1*b*, the pivots 2*a* and 2*b*, the pivots 3*a* and 3*b*, the pivots 4*a* and 4*b*, the pivots 5*a* and 5*b*, and the pivots 6*a* and 6*b* are pivots arranged with the insulative couplers 1, 2, 3, 4, 5, and 6, respectively.

A member 51 is a first member configured to couple together two or more first insulative couplers such as the insulative couplers 1, 3, 5, and so on. Accordingly, when a force toward the right-hand side of FIG. 5 is applied to the member 51, the two or more first insulative couplers such as the insulative coupler 1, 3, 5, and so on are displaced toward the right-hand side. Further, a member 52 is a second member configured to couple together two or more second insulative couplers such as the insulative couplers 2, 4, 6, and so on. Accordingly, when a force toward the left-hand side of FIG. 5 is applied to the member 52, the two or more second insulative couplers such as the insulative couplers 2, 4, 6, and so on are displaced toward the left-hand side. Consequently, by applying a force toward the right-hand side to the member 51 and conversely applying a force toward the left-hand side to the member 52, it is possible to displace the insulative couplers 1, 3, and 5 toward the right-hand side and to conversely displace the insulative couplers 2, 4, and 6 toward the left-hand side. In this manner, because the forces applied to the insulative couplers are transmitted to the entirety of the array coil 200, by applying the forces to the member 51 and to the member 52, it is possible to cause the entirety of the array coil 200 to expand and contract.

As explained above, the array coil 200 according to the first embodiment is configured to be expandable and contractible while realizing the decoupling of the element coils from one another. It is therefore possible to obtain an array coil having a size that is suitable for various image taking sites and image taking methods.

Further, in the array coil 200 according to the first embodiment, because the element coils are shaped to be able to fill the plane, it is possible to freely change the quantity and the positional arrangement of array coils. It is therefore possible to easily two-dimensionally increase the size, or the like.

Figure 6:
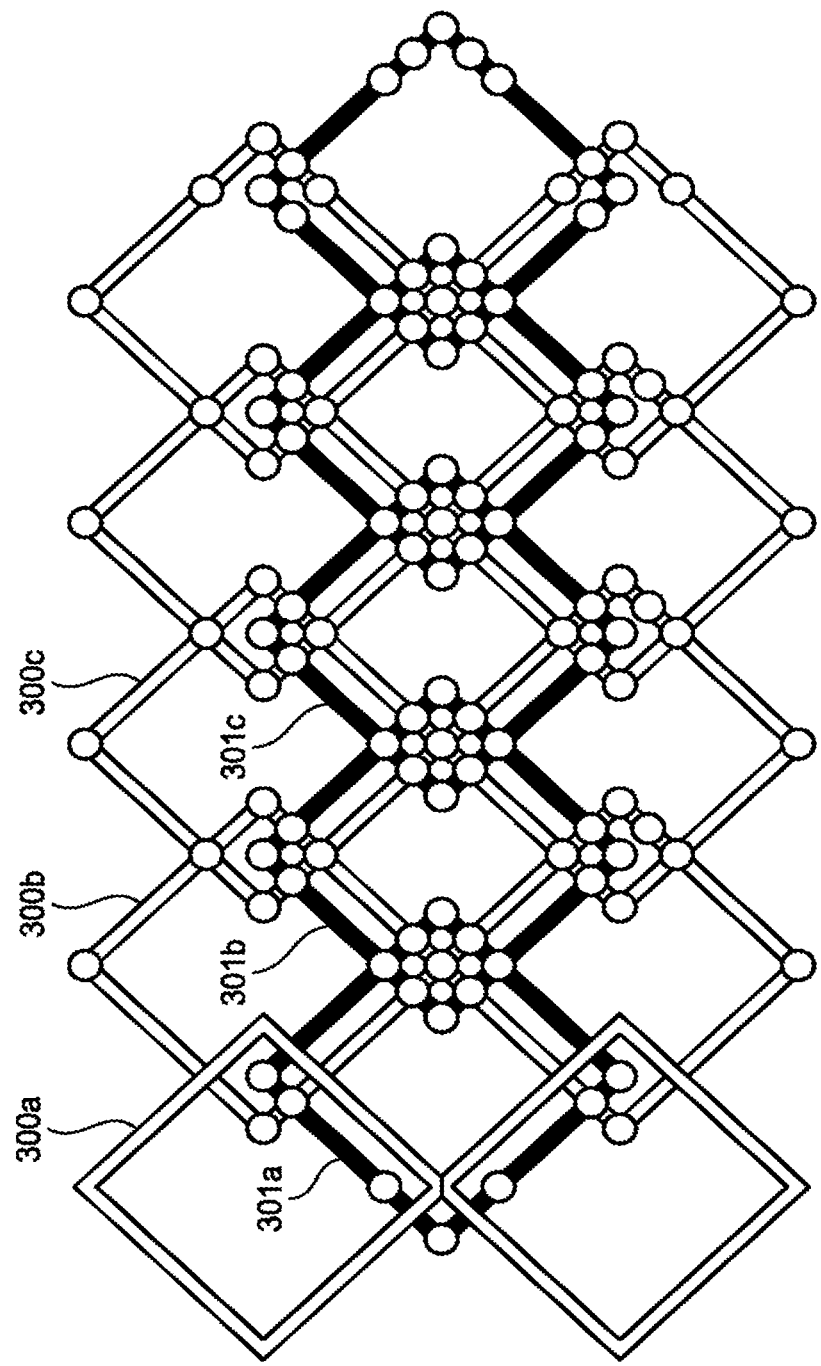
FIG. 6 is a drawing for explaining an array coil according to a comparison example.

This characteristic will be discussed while using a comparison example. FIG. 6 illustrates a positional arrangement of element coils in an array coil according to the comparison example. In the array coil according to the comparison example, the array coil is structured by using two types of coils, namely, element coils 300*a*, 300*b*, and 300*c* each of which is an element coil having a figure-8 shape and element coils 301*a*, 301*b*, and 301*c* each of which is an element coil having a square shape. In the comparison example, for instance, the element coils are arranged so as to realize, at the maximum level, decoupling of the element coils 300*a* and 300*b* from each other, decoupling of the element coils 300*a* and 301*a* from each other, and decoupling of the element coils 301*a* and 300*b* from each other. However, in the example illustrated in FIG. 6, when a new line of element coils is newly added to the coils illustrated in FIG. 6, it would be difficult to realize decoupling of the added element coils and the existing element coil from one another.

In contrast, in the array coil 200 according to the first embodiment, because the element coils are shaped to be able to fill the plane, it is possible to freely change the quantity and the positional arrangements of array coils.

Actually, by newly adding element coils by copying the positional arrangement of the existing element coils, it is possible to realize decoupling of the existing element coils and the newly-added element coils from one another. It is therefore possible to freely increase the quantity of element coils included in the array coil 200.

Further, the array coil 200 may be configured to be able to change the shape thereof into a circular cylindrical shape, so as to become a coil suitable for image taking processes performed on a knee or the like, for example.

Second Embodiment

In a second embodiment, an example will be explained in which insulative couplers are arranged in positions different from those in the first embodiment, with reference to FIGS. 7 and 8. With this configuration, an advantage is achieved where it is possible to easily manufacture the array coil.

Figure 7:
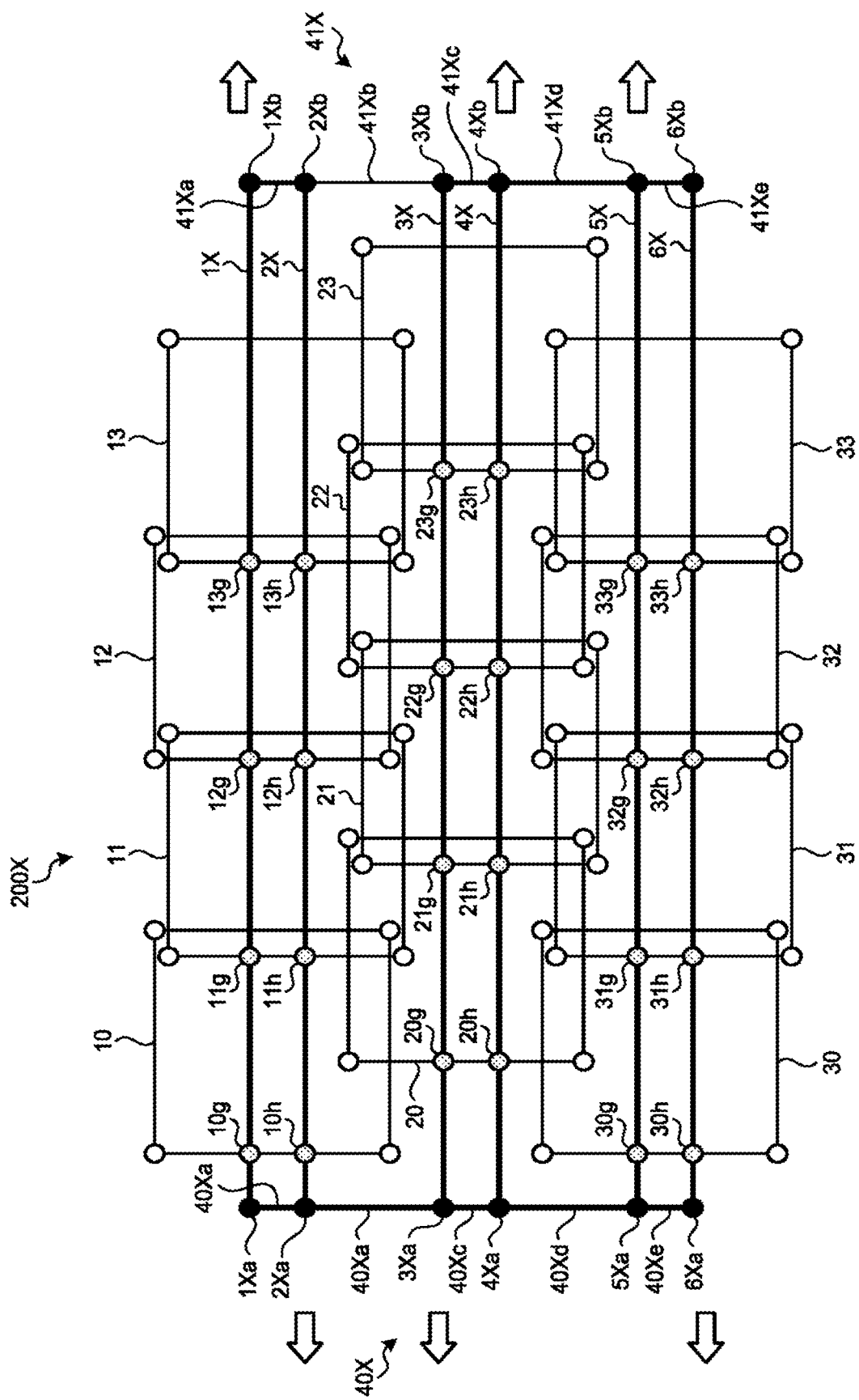
FIG. 7 is a drawing for explaining an array coil according to a second embodiment.

FIG. 7 is a drawing for explaining an array coil 200X according to the second embodiment. The array coil 200X according to the second embodiment is the same as the array coil 200 according to the first embodiment with regard to the positional arrangements of the element coils 10 to 13, 20 to 22, 30 to 33, and so on and of the pivots positioned in the corner parts of the element coils, but is different with regard to the positional arrangements of fixation points and insulative couplers.

In FIG. 7, a fixation point 10*g* is a first fixation point in the element coil 10 and is used for fixing an insulative coupler 1X and the element coil 10 together. Further, a fixation point 10*h* is a second fixation point in the element coil 10 and is used for fixing an insulative coupler 2X and the element coil 10 together. The fixation points 10*g* and 10*h* are each structured so that the angle formed by a conductive member of the element coil 10 and a corresponding one of the insulative couplers 1X and 2X is variable. The fixation points 10*g* and 10*h* may each be realized by using a pivot, for example.

A fixation point 11*g* is a first fixation point and is used for fixing the insulative coupler 1X and the element coil 11 together. Further, a fixation point 11*h* is a second fixation point used for fixing the insulative coupler 2X and the element coil 11 together. Also, a fixation point 12*g* is a first fixation point used for fixing the insulative coupler 1X and the element coil 12 together. In addition, a fixation point 12*h* is a second fixation point used for fixing the insulative coupler 2X and the element coil 12 together. Furthermore, a fixation point 13*g* is a first fixation point used for fixing the insulative coupler 1X and the element coil 13 together. In addition, a fixation point 13*h* is a second fixation point used for fixing the insulative coupler 2X and the element coil 13 together. Fixation points 20*g*, 21*g*, 22*g*, and 23*g* are each a first fixation point used for fixing an insulative coupler 3X and a corresponding one of the element coils 20, 21, 22, and 23 together, respectively. Fixation points 20*h*, 21*h*, 22*h*, and 23*h* are each a second fixation point used for fixing an insulative coupler 4X and a corresponding one of the element coils 20, 21, 22, and 23 together, respectively. Similarly, fixation points 30g, 31g, 32g, and 33g are each a fixation point used for fixing an insulative coupler 5X and a corresponding one of the element coils 30, 31, 32, and 33 together, respectively. Furthermore, fixation points 30h, 31h, 32h, and 33h are each a fixation point used for fixing an insulative coupler 6X and a corresponding one of the element coils 30, 31, 32, and 33 together, respectively. Each of the fixation points is realized by using a pivot, for example.

The insulative couplers 1X, 2X, 3X, 4X, 5X, and 6X are each a member configured to couple a plurality of element coils in the first direction, by using the fixation points of the element coils. Each of the insulative couplers 1X, 2X, 3X, 4X, 5X, and 6X is configured by using an insulative member such as a plastic stick, for example; however, the material of each of the insulative couplers 1X, 2X, 3X, 4X, 5X, and 6X is not limited to a stick, and may be a material that is flexible and of which the shape can freely be changed. The insulative coupler 1X is configured to couple together a plurality of fixation points in the first direction, by coupling together the fixation point 10g of the element coil 10, the fixation point 11g of the element coil 11, the fixation point 12g of the element coil 12, and the fixation point 13g of the element coil 13. The insulative coupler 2X is configured to couple together a plurality of fixation points in the first direction, by coupling together the fixation point 10h of the element coil 10, the fixation point 11h of the element coil 11, the fixation point 12h of the element coil 12, and the fixation point 13h of the element coil 13. Similarly, the insulative coupler 3X is configured to couple together the fixation points 20g, 21g, 22g, and 23g. Also, the insulative coupler 4X is configured to couple together the fixation points 20h, 21h, 22h, and 23h. The insulative coupler 5X is configured to couple together the fixation points 30g, 31g, 32g, and 33g. The insulative coupler 6X is configured to couple together the fixation points 30h, 31h, 32h, and 33h.

As explained above, similarly to the first embodiment, in the second embodiment also, each of the element coils included in the array coil 200X has the first fixation point and the second fixation point and includes at least a first insulative coupler configured to couple together two or more of the plurality of first fixation points in the first direction and a second insulative coupler configured to couple together two or more of the plurality of second fixation points in the first direction. For example, the insulative couplers 1X, 3X, and 5X are each an example of the first insulative coupler configured to couple together two or more of the first fixation points in the first direction. Further, the insulative couplers 2X, 4X, and 6X are each an example of the second insulative coupler configured to couple together two or more of the second fixation points in the first direction.

Further, in the second embodiment, at least one selected from between the first insulative couplers and the second insulative couplers is positioned in a region other than the regions in which a plurality of element coils are arranged so as to overlap one another in the second direction. For example, the insulative coupler 1X, which is one of the first insulative couplers, and the insulative coupler 2X, which is one of the second insulative couplers, are positioned in a region other than the regions in which the element coils 10, 11, 12, and 13 and the element coils 20, 21, 22, and 23 are arranged so as to overlap one another in the second direction. With this arrangement, it is possible to easily manufacture the array coil 200X, because there is no possibility that another insulative coupler may further overlap with the overlapping part in which the element coils overlap one another in the second direction.

A member 40X is a member configured to fix the insulative couplers 1X, 2X, 3X, 4X, 5X, 6X, and so on via pivots 1Xa, 2Xa, 3Xa, 4Xa, 5Xa, and 6Xa. More specifically, the member 40X includes a member 40Xa that is a part between the pivot 1Xa and the pivot 2Xa, a member 40Xb that is a part between the pivot 2Xa and the pivot 3Xa, a member 40Xc that is a part between the pivot 3Xa and the pivot 4Xa, a member 40Xd that is a part between the pivot 4Xa and the pivot 5Xa, a member 40Xe that is a part between the pivot 5Xa and the pivot 6Xa, and so on. The pivots 1Xa, 2Xa, 3Xa, 4Xa, 5Xa, and 6Xa are fixed to the insulative couplers 1X, 2X, 3X, 4X, 5X, and 6X, respectively. Further, to ensure that the angles formed by the members 40Xa, 40Xb, 40Xc, 40Xd, and 40Xe with one another are variable, the joints between these members are configured by using pivotable constituent elements.

Similarly, a member 41X is a member configured to fix the insulative couplers 1X, 2X, 3X, 4X, 5X, 6X, and so on via pivots 1Xb, 2Xb, 3Xb, 4Xb, 5Xb, and 6Xb. More specifically, the member 41X includes a member 41Xa that is a part between the pivot 1Xb and the pivot 2Xb, a member 41Xb that is a part between the pivot 2Xb and the pivot 3Xb, a member 41Xc that is a part between the pivot 3Xb and the pivot 4Xb, a member 41Xd that is a part between the pivot 4Xb and the pivot 5Xb, a member 41Xe that is a part between the pivot 5Xb and the pivot 6Xb, and so on. The pivots 1Xb, 2Xb, 3Xb, 4Xb, 5Xb, and 6Xb are fixed to the insulative couplers 1X, 2X, 3X, 4X, 5X, and 6X, respectively. Further, to ensure that the angles formed by the members 41Xa, 41Xb, 41Xc, 41Xd, and 41Xe with one another are variable, the joints between these members are configured by using pivotable constituent elements.

The members 40X and 41X may further be coupled to a frame, for example. For instance, as indicated by the arrows in FIG. 7, the insulative couplers 1, 4, and 5 may further be coupled together, while the insulative couplers 2, 3, and 6 are further coupled together, so as to pull the insulative couplers 1, 4, and 5 toward the right-hand side and to conversely pull the insulative couplers 2, 3, and 6 toward the left-hand side.

Expansion and contraction of the array coil 200X configured as described above are illustrated in FIG. 8. FIG. 8 is a drawing for explaining the expansion and the contraction of the array coil 200X according to the second embodiment.

Figure 8:
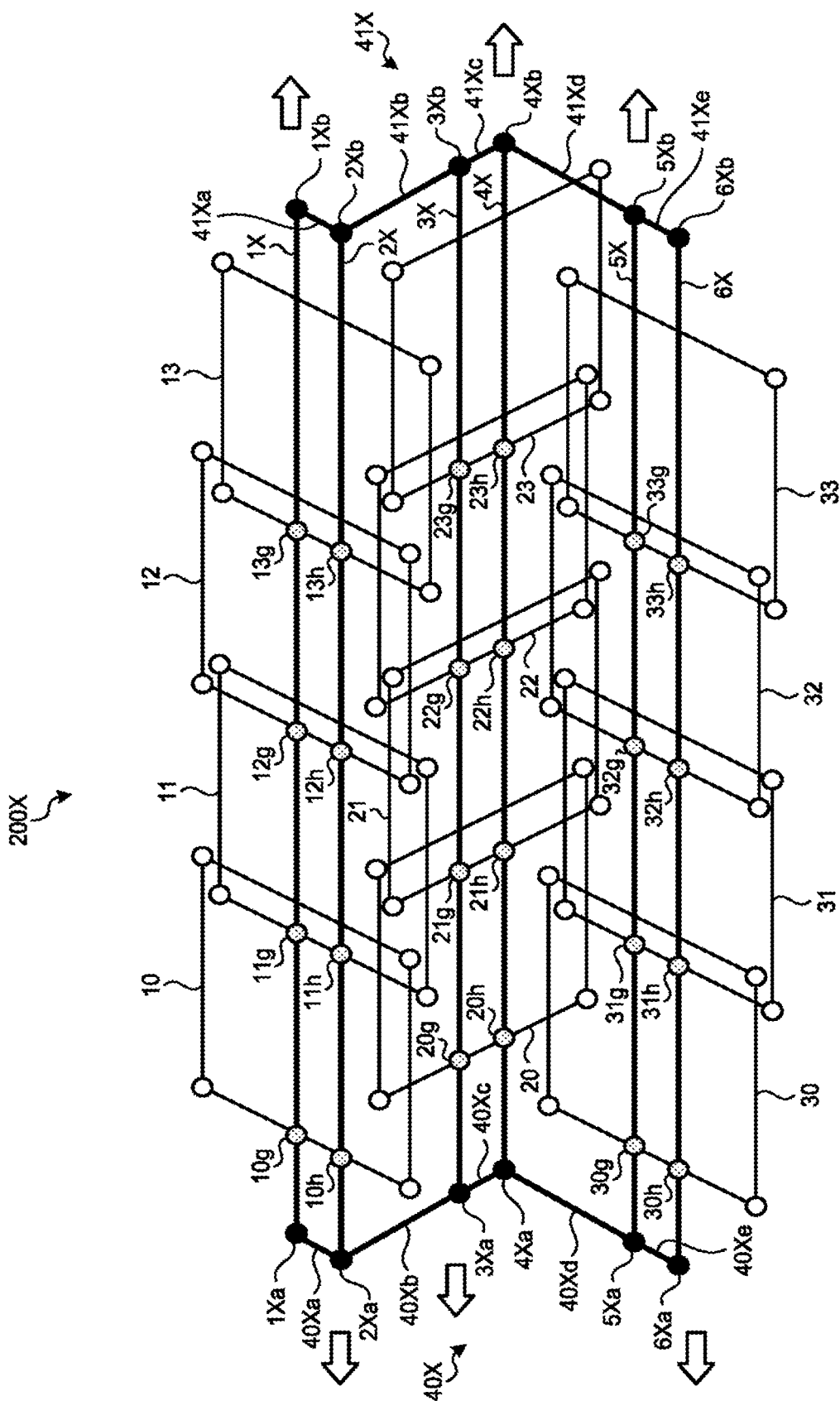
FIG. 8 is another drawing for explaining the array coil according to the second embodiment.

In the array coil 200X illustrated in FIG. 8, when a force is applied in the direction indicated by the arrows, the insulative couplers 1X, 4X, and 5X are displaced toward the right-hand side, whereas the insulative couplers 2X, 3X, and 6X are displaced toward the left-hand side. These displacements are transmitted to the entirety of the array coil 200X, so that the array coil 200X expands and contracts. Accordingly, the array coil 200X is configured to be expandable and contractible.

In the second embodiment also, even when the array coil 200X has changed the shape thereof as illustrated in FIG. 8, because the ratio of the overlapping area between the element coils to the area of each of the element coils remains unchanged even after the change of the shape, the decoupling of the element coils from one another is realized even after the expansion and the contraction.

As explained above, the array coil 200X according to the second embodiment is configured to be expandable and contractible while realizing the decoupling of the element coils from one another. It is therefore possible to obtain an array coil having a size that is suitable for various image taking sites and image taking methods. Further, the array coil 200X is configured so as to be easily manufactured.

Other Embodiments

Possible embodiments are not limited to those explained above. In the embodiments above, the examples are explained in which each of the element coils is rectangular; however, possible embodiments are not limited to this example. For instance, each of the plurality of element coils may be a hexagonal coil having pivotable corners. FIG. 9 illustrates an element coil in such an example. FIG. 9 is a drawing for explaining one of element coils included in an array coil according to another embodiment.

In FIG. 9, pivots 10Xa, 10Xb, 10Xc, 10Xd, 10Xe, 10Xf are each a pivot configured as an element capable of changing the angle formed by two conductive members while keeping the conduction states thereof. Capacitors 60Xa and 60Xb are each a capacitor configured to structure an LC resonant circuit together with the conductive members. A magnetic resonance signal induced by the circuit is output to output terminals 61a and 61b. The output terminals 61a and 61b are connected to the receiver circuitry 110.

Further, possible shapes of the element coils are not limited to the shapes explained above. It is sufficient when the changing of the shape in two directions is based on a rectangle having sides extending parallel to each of the two directions, while apexes are added so as to be symmetrical with respect to one of the directions. It should be noted, however, that when the shapes of the element coils are not rectangles, it may not be possible, in some situations, to realize the decoupling only with the overlapping of the element coils when the shapes thereof have been changed. In those situations, it is possible to use a method employing a pre-amplifier or the like (see, for example, the specification of U.S. Pat. No. 4,825,162).

According to at least one aspect of the embodiments described above, it is possible to provide an array coil that is expandable and contractible while realizing the decoupling of the element coils from one another.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An array coil comprising:
   a plurality of element coils each of which has a first fixation point and a second fixation point and which are two-dimensionally arrayed in a first direction and a second direction while overlapping one another;
   a first electrically-insulative stick configured to couple together two or more of the plurality of first fixation points in the first direction, each of at least two of the two or more of the plurality of the first fixation points belonging to a different one of the plurality of element coils; and
   a second electrically-insulative stick configured to couple together two or more of the plurality of second fixation points in the first direction, each of at least two of the two or more of the plurality of the second fixation points belonging to a different one of the plurality of element coils.

2. The array coil according to claim 1, wherein each of the plurality of element coils is a polygonal coil having even-numbered pivotable corners.

3. The array coil according to claim 1, wherein each of the plurality of element coils is a rectangular or hexagonal coil having pivotable corners.

4. The array coil according to claim 1, wherein the array coil is able to change a shape thereof into a circular cylindrical shape.

5. The array coil according to claim 1, wherein
   each of the plurality of element coils is configured to include a pivot that changes an angle formed by two electrically-conductive members, and
   the pivot insulatively connects the two electrically-conductive members.

6. The array coil according to claim 1, comprising:
   two or more of the first electrically-insulative sticks; and
   two or more of the second electrically-insulative sticks, wherein
   the array coil further comprises:
     a first member configured to couple together the two or more first electrically-insulative sticks; and
     a second member configured to couple together the two or more second electrically-insulative sticks.

7. The array coil according to claim 1, wherein at least one selected from between the first electrically-insulative stick and the second electrically-insulative stick is configured to couple together two or more of the element coils that are positioned adjacent to one another in the second direction.

8. An array coil comprising:
   a plurality of element coils each of which has a first fixation point and a second fixation point and which are two-dimensionally arrayed in a first direction and a second direction while overlapping one another;
   a first electrically-insulative coupler configured to couple together two or more of the plurality of first fixation points in different ones of the plurality of element coils in the first direction; and
   a second electrically-insulative coupler configured to couple together two or more of the plurality of second fixation points in different ones of the plurality of element coils in the first direction, wherein at least one selected from between the first electrically-insulative coupler and the second electrically-insulative coupler is positioned in a region other than a region in which the plurality of element coils are arranged so as to overlap one another in the second direction.

\* \* \* \* \*